(12) United States Patent
Yoshida

(10) Patent No.: US 10,340,909 B2
(45) Date of Patent: Jul. 2, 2019

(54) BUFFER CIRCUIT AND SEMICONDUCTOR DEVICE

(71) Applicant: Mitsubishi Electric Corporation, Tokyo (JP)

(72) Inventor: Kentaro Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/767,666

(22) PCT Filed: Jan. 7, 2016

(86) PCT No.: PCT/JP2016/050291
§ 371 (c)(1),
(2) Date: Apr. 12, 2018

(87) PCT Pub. No.: WO2017/119090
PCT Pub. Date: Jul. 13, 2017

(65) Prior Publication Data
US 2018/0309437 A1    Oct. 25, 2018

(51) Int. Cl.
| H03K 17/0812 | (2006.01) |
| H02M 1/08 | (2006.01) |
| H03K 17/16 | (2006.01) |
| H03K 17/687 | (2006.01) |
| H03K 17/74 | (2006.01) |

(Continued)

(52) U.S. Cl.
CPC ........ H03K 17/08128 (2013.01); H02M 1/08 (2013.01); H03K 17/162 (2013.01); H03K 17/168 (2013.01); H03K 17/567 (2013.01); H03K 17/6877 (2013.01); H03K 17/74 (2013.01); H02M 1/44 (2013.01);

(Continued)

(58) Field of Classification Search
CPC .......... H03K 17/08128; H03K 17/162; H03K 17/168; H03K 17/567; H03K 17/6877; H03K 17/74; H03K 17/163
USPC .... 327/108–112, 427, 434, 437; 326/82, 83, 326/87
See application file for complete search history.

(56) References Cited

U.S. PATENT DOCUMENTS

2016/0134271 A1 *  5/2016  Hayashi .......... H03K 17/08128
327/109

FOREIGN PATENT DOCUMENTS

| JP | 2010-130557 A | 6/2010 |
| JP | 2010130557 A * | 6/2010 |

(Continued)

OTHER PUBLICATIONS

International Search Report issued in PCT/JP2016/050291; dated Mar. 29, 2016.

(Continued)

*Primary Examiner* — Tomi Skibinski
(74) *Attorney, Agent, or Firm* — Studebaker & Brackett PC

(57) ABSTRACT

Provided is a technique for a stably operable complementary single ended push pull (SEPP) circuit. A buffer circuit includes the following: an NPN transistor and a PNP transistor that constitute a complementary SEPP circuit; a first resistor; a second resistor; a first load element having one end connected to a gate of a semiconductor switching element and another end connected to a base of the NPN transistor; and a second load element having one end connected to the gate of the semiconductor switching element and another end connected to a base of the PNP transistor.

8 Claims, 10 Drawing Sheets

(51) Int. Cl.
  *H03K 17/567* (2006.01)
  *H02M 1/44* (2007.01)
  *H02M 1/00* (2006.01)
(52) U.S. Cl.
  CPC ... *H02M 2001/0054* (2013.01); *H03K 17/163* (2013.01); *Y02B 70/1491* (2013.01)

(56) References Cited

FOREIGN PATENT DOCUMENTS

JP   WO 2015033444 A1 *  3/2015   ....... H03K 17/08128
WO   2015/033444 A1   3/2015

OTHER PUBLICATIONS

Notification of Transmittal of Translation of the International Preliminary Report on Patentability (Chapter I) and Translation of Written Opinion of the International Searching Authority; PCT/JP20161050291; dated Jul. 19, 2018.

\* cited by examiner

F I G . 1
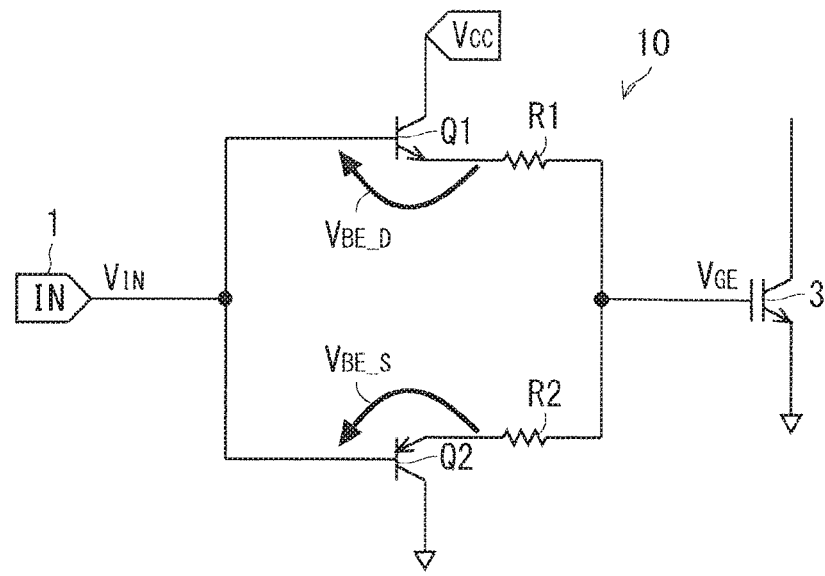
F I G . 2
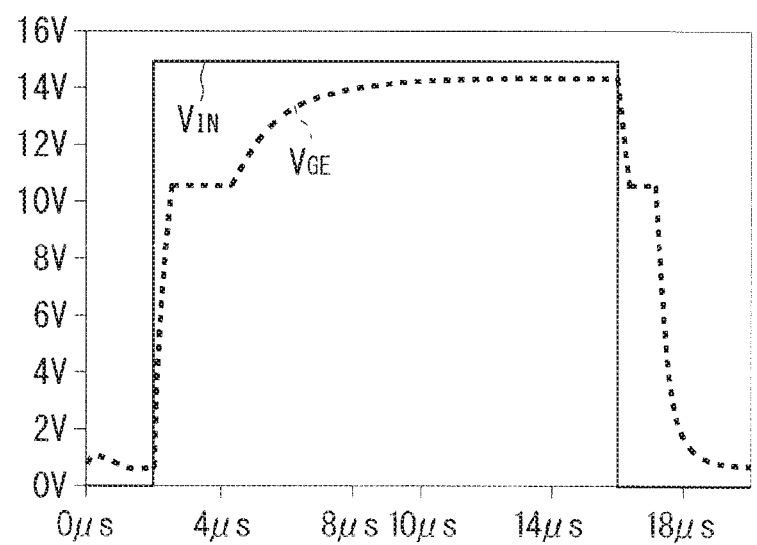

F I G . 5
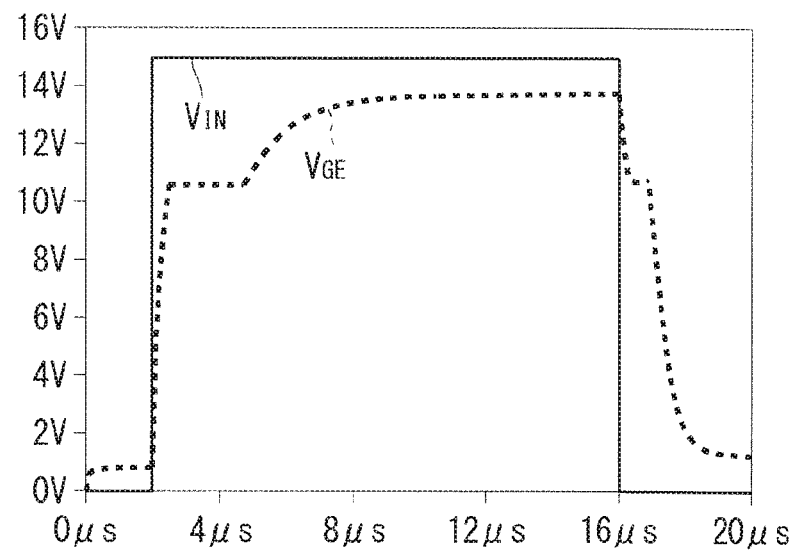
F I G . 6
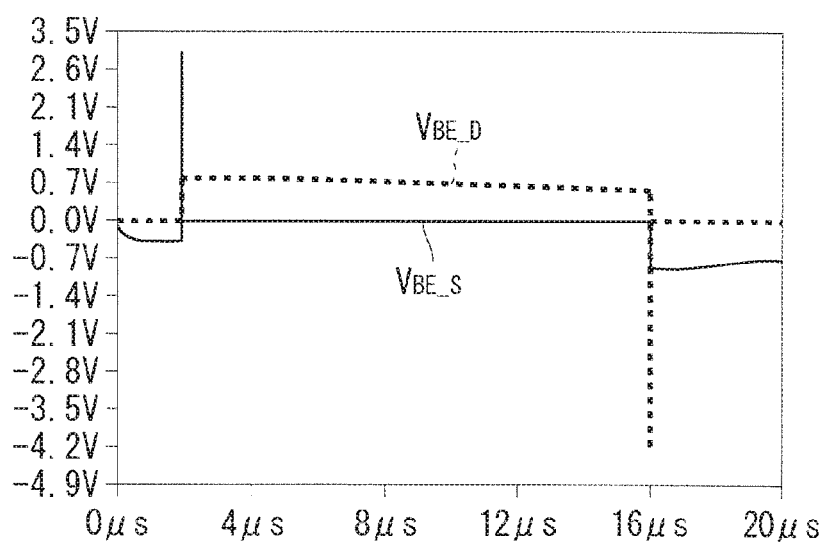

F I G. 7
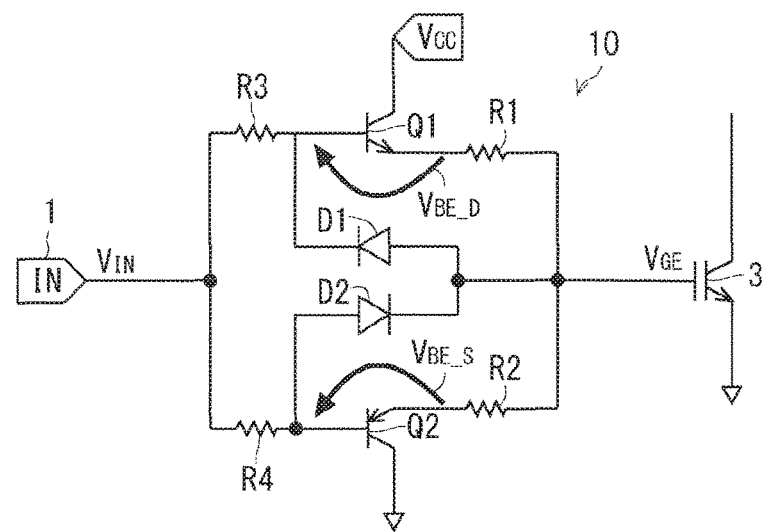
F I G. 8
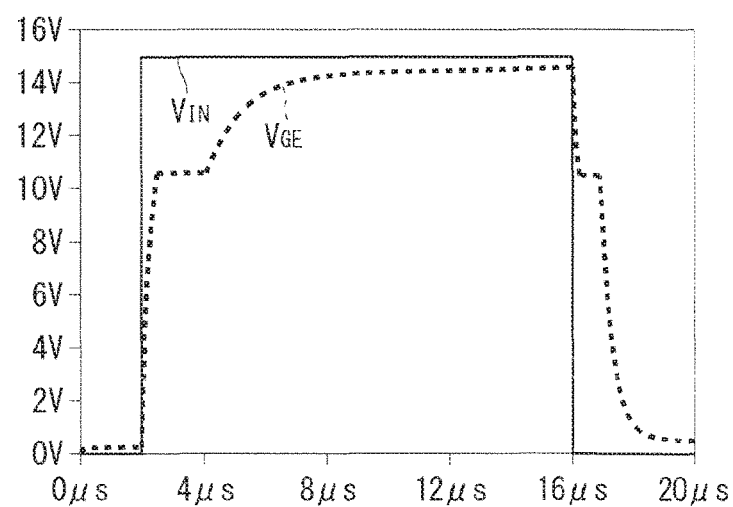

F I G . 1 1
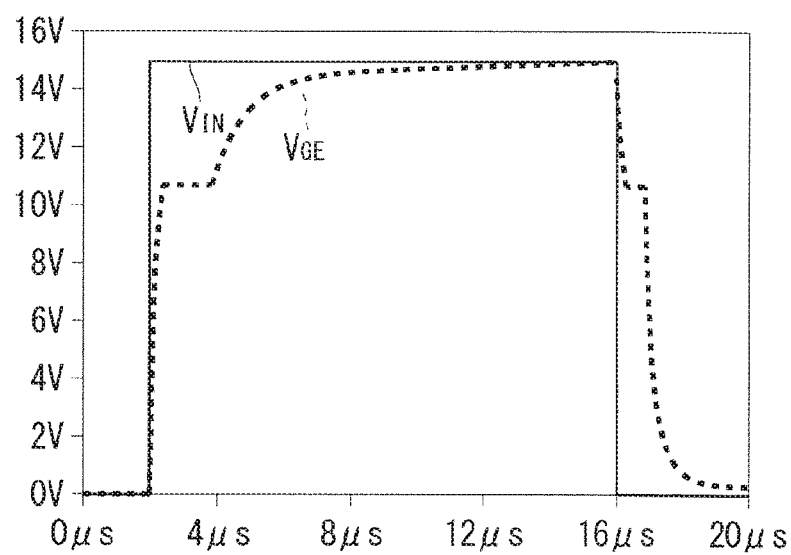
F I G . 1 2
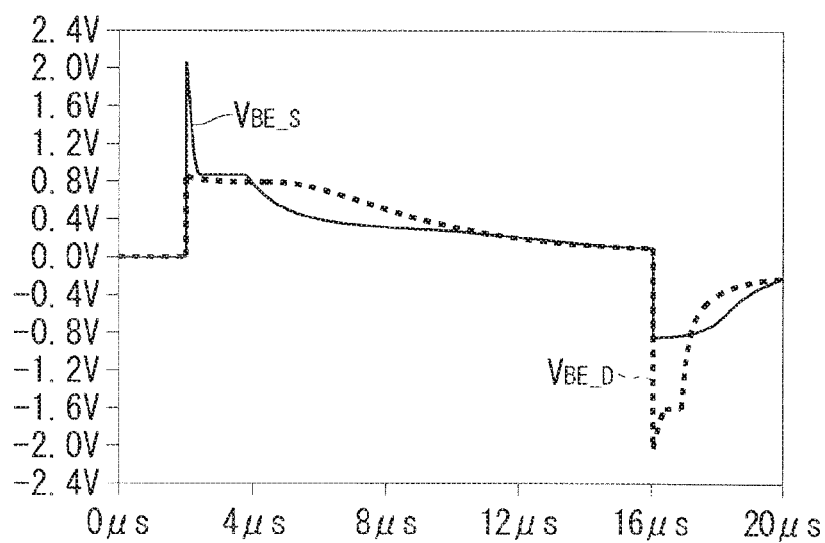

F I G . 1 3
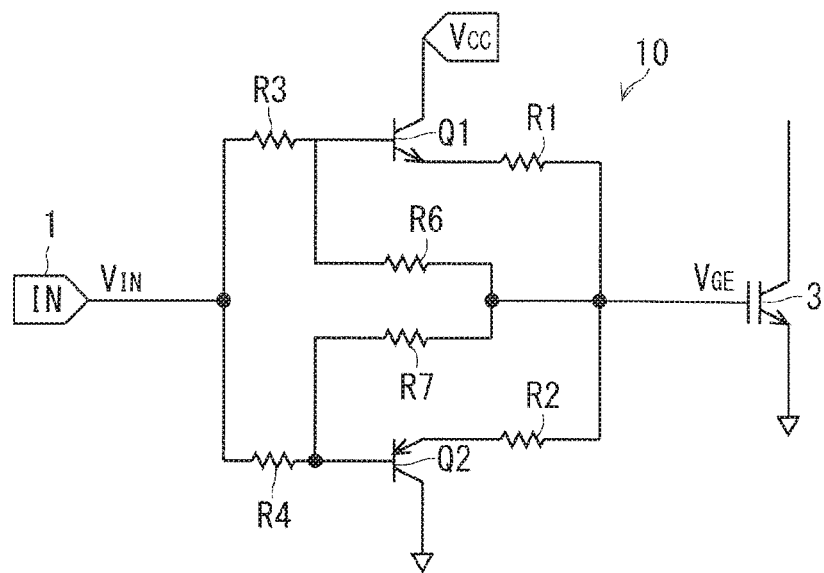
F I G . 1 4
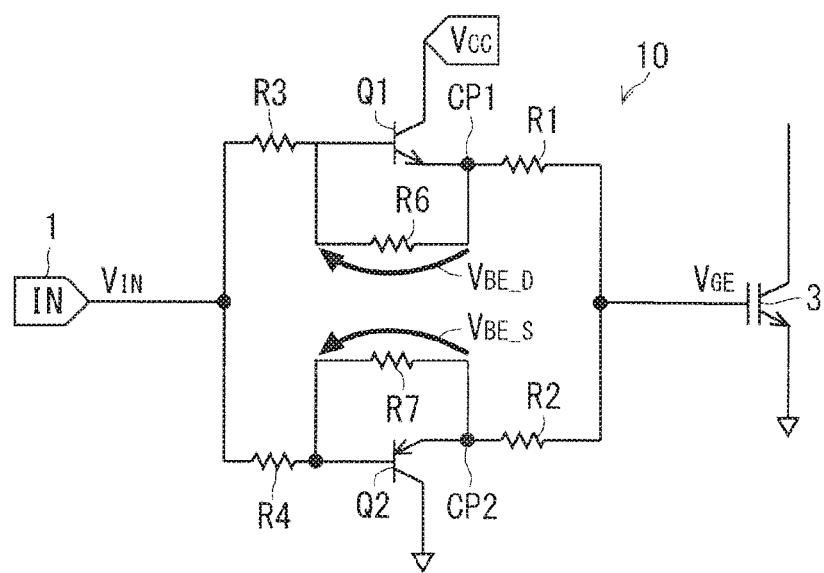

F I G. 1 5
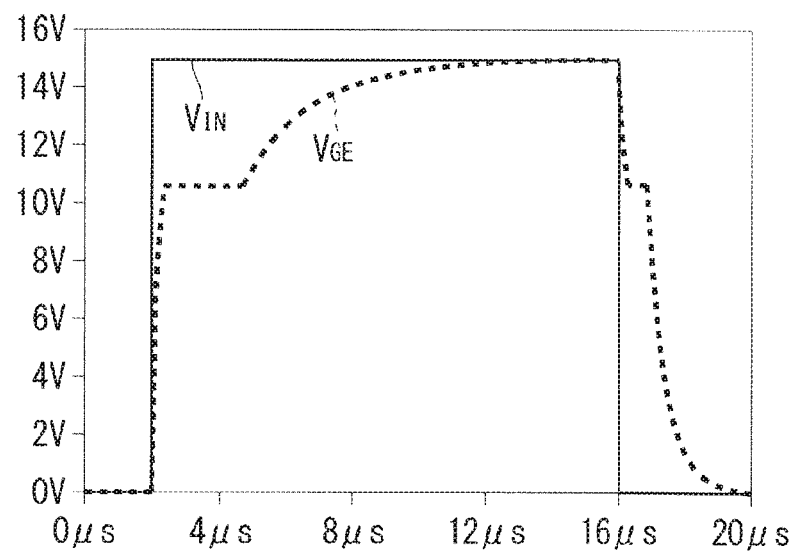
F I G. 1 6
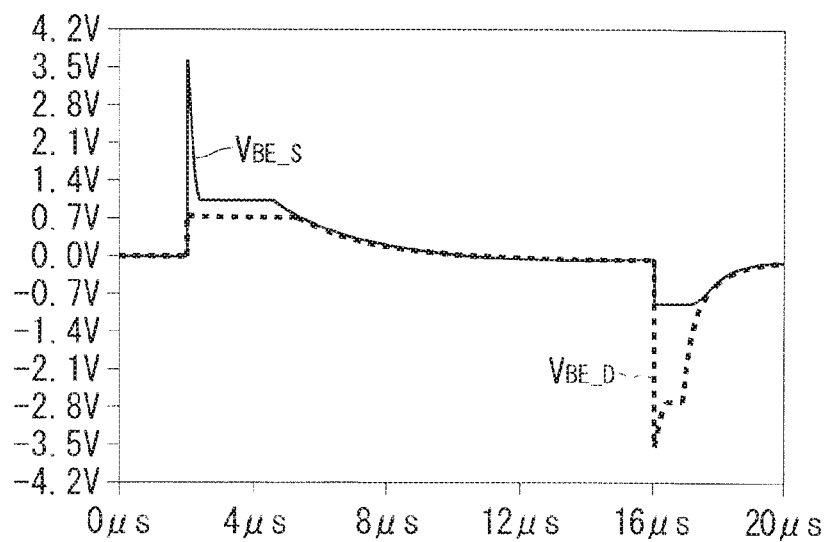

F I G. 1 7
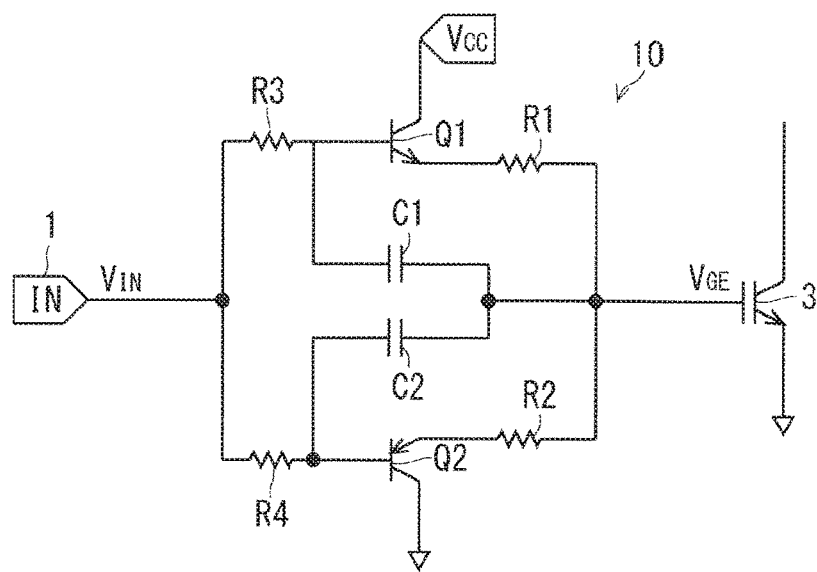
F I G. 1 8
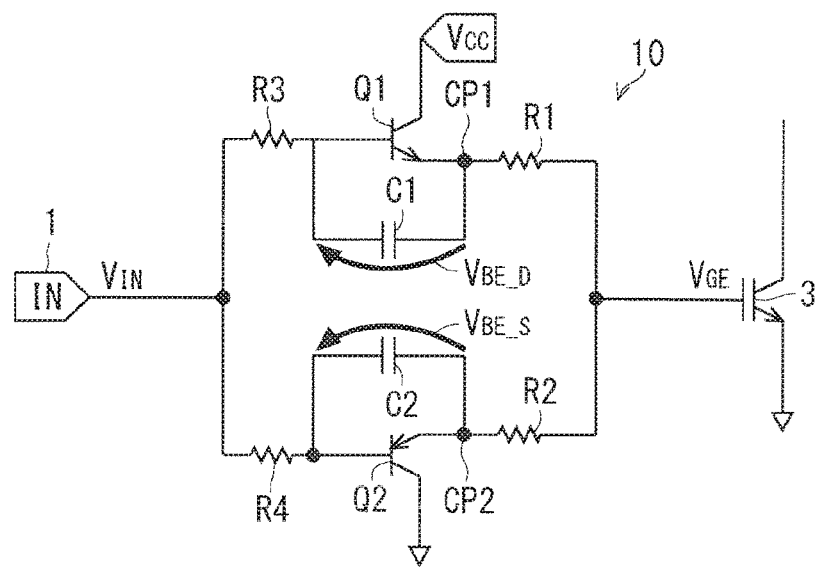

F I G . 1 9
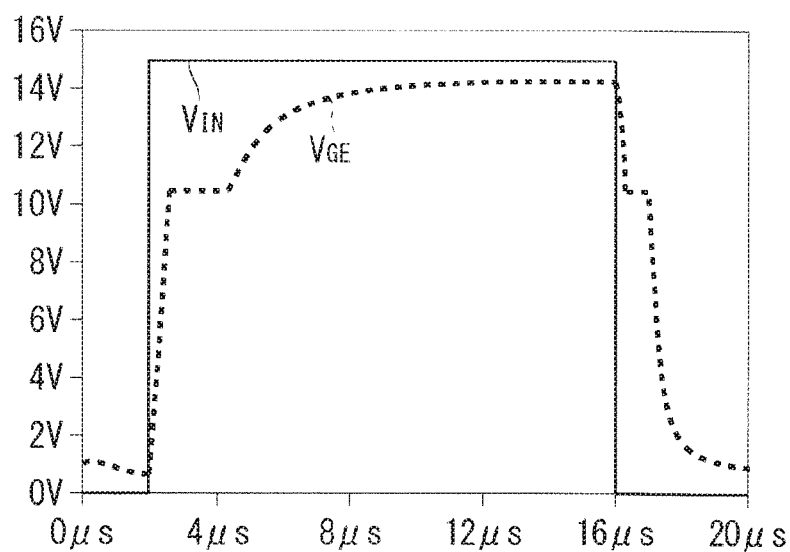
F I G . 2 0
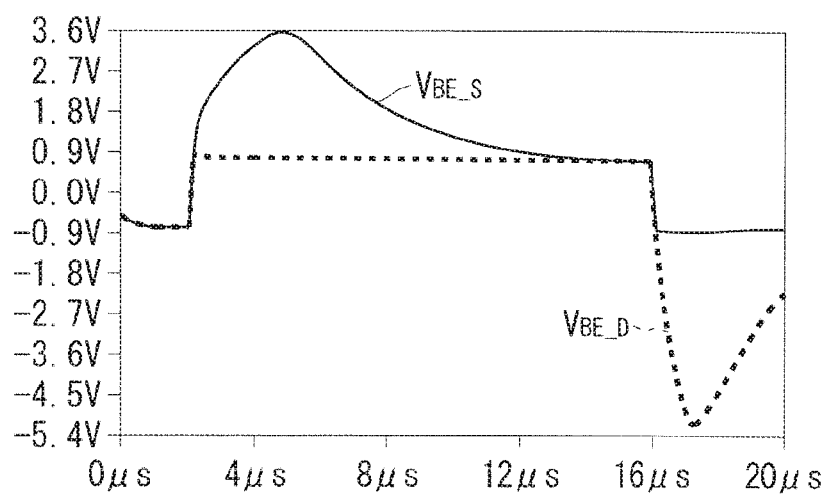

BUFFER CIRCUIT AND SEMICONDUCTOR DEVICE

TECHNICAL FIELD

The present invention relates to a buffer circuit configured to control switching speeds of a semiconductor switching element during turn-on and turn-off operations of the semiconductor switching element, and to a semiconductor device including the buffer circuit.

BACKGROUND ART

While a semiconductor switching element is turning-on, a recovery current causes a radiated noise and a turn-on loss for instance. Conversely, while the semiconductor switching element is turning-off, a surge voltage causes an overvoltage and a turn-off loss for instance. As such, the semiconductor switching element behaves in a different manner during its turn-on and turn-off operations in driving its switching operations. Accordingly, the turn-on and the turn-off operations need to have switching speeds (hereinafter referred to as "SW speeds") different from each other.

In order to individually control the SW speeds of the turn-on and turn-off operations, a buffer circuit has been proposed that includes a complementary single ended push pull (hereinafter abbreviated as a "complementary SEPP") circuit (e.g., Patent Document 1). Patent Document 1 discloses a technique for preventing a reverse voltage of an NPN transistor and a reverse voltage of a PNP transistor that constitute the complementary SEPP, thereby enabling the complementary SEPP circuit to stably operate.

PRIOR ART DOCUMENT

Patent Document

Patent Document 1: Japanese Patent Application Laid-Open No. 2010-130557

SUMMARY

Problem to be Solved by the Invention

Unfortunately, the complementary SEPP circuit needs to be improved for its stable operation.

The present invention has been made in view of the aforementioned problem. It is an object of the present invention to provide a technique for a stably operable complementary SEPP circuit.

Means to Solve the Problem

A buffer circuit according to an aspect of the present invention is connected to an input terminal and a gate of a semiconductor switching element. The buffer circuit includes the following: an NPN transistor and a PNP transistor that constitute a complementary single ended push pull circuit; a first resistor connected between the gate and an emitter of the NPN transistor; a second resistor connected between the gate and an emitter of the PNP transistor; a first load element having one end connected to the gate and another end connected to a base of the NPN transistor; a second load element having one end connected to the gate and another end connected to a base of the PNP transistor; a third resistor connected between the input terminal and the base of the NPN transistor; and a fourth resistor connected between the input terminal and the base of the PNP transistor.

Effects of the Invention

In the aspect of the present invention, the buffer circuit prevents a reverse voltage applied between the base of each of the NPN transistor and the PNP transistor, and the emitter of the same. This achieves stable operation of a complementary SEPP circuit.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a circuit diagram illustrating a configuration of a first related semiconductor device.

FIG. 2 is a graph showing results of a simulation of the first related semiconductor device.

FIG. 5 is a graph showing results of a simulation of the second related semiconductor device.

FIG. 6 is a graph showing results of the simulation of the second related semiconductor device.

FIG. 7 is a circuit diagram illustrating a configuration of a semiconductor device according to a first embodiment.

FIG. 8 is a graph showing results of a simulation of the semiconductor device according to the first embodiment.

FIG. 11 is a graph showing results of a simulation of the semiconductor device according to the second embodiment.

FIG. 12 is a graph showing results of the simulation of the semiconductor device according to the second embodiment.

FIG. 13 is a circuit diagram illustrating a configuration of a semiconductor device according to a third embodiment.

FIG. 14 is a circuit diagram illustrating a configuration of a semiconductor device according to a modification.

FIG. 15 is a graph showing results of a simulation of the semiconductor device according to the modification.

FIG. 16 is a graph showing results of the simulation of the semiconductor device according to the modification.

FIG. 17 is a circuit diagram illustrating a configuration of a semiconductor device according to a fourth embodiment.

FIG. 18 is a circuit diagram illustrating a configuration of a semiconductor device according to a modification.

FIG. 19 is a graph showing results of a simulation of the semiconductor device according to the modification.

FIG. 20 is a graph showing results of the simulation of the semiconductor device according to the modification.

DESCRIPTION OF EMBODIMENT(S)

Figure 3:
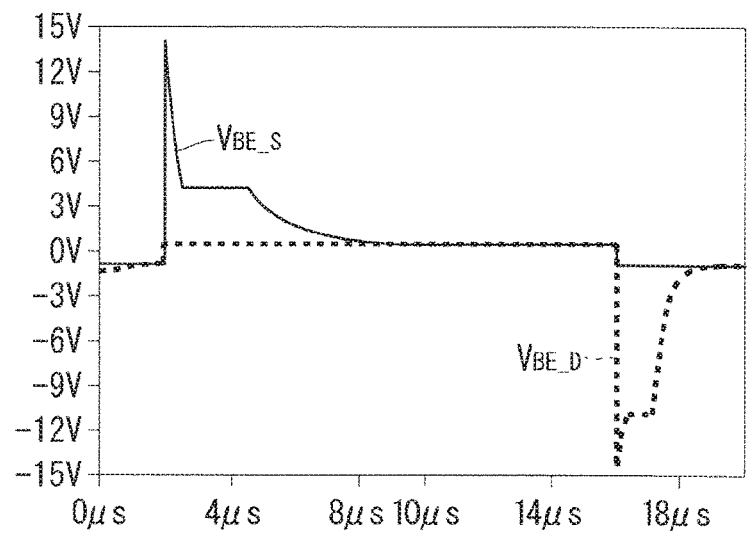
FIG. 3 is a graph showing results of the simulation of the first related semiconductor device.

Prior to description of semiconductor devices according to embodiments of the present invention, the following describes a first semiconductor device and a second semiconductor device that relate to the semiconductor devices according to the embodiments (hereinafter referred to as a "first related semiconductor device" and a "second related semiconductor device").

<First Related Semiconductor Device>

FIG. 1 is a circuit diagram illustrating a configuration of a first related semiconductor device. The first related semiconductor device includes an input terminal 1, a semiconductor switching element 3, and a buffer circuit 10.

The input terminal 1 is connected to an output portion of a control circuit (not shown) configured to control the semiconductor device, and receives an input-terminal voltage $V_{IN}$.

Upon receiving a voltage corresponding to the input-terminal voltage $V_{IN}$ via the buffer circuit 10, the semiconductor switching element 3 is selectively turned on and turned off. Examples of the semiconductor switching element 3 include an insulated gate bipolar transistor (IGBT) and a metal oxide semiconductor field effect transistor (MOSFET).

The semiconductor switching element 3 is formed of a wide bandgap semiconductor made of a material, such as silicon carbide (SiC), gallium nitride (GaN), and diamond. Consequently, the first related semiconductor device stably operates under high temperature and achieves faster SW speeds.

The buffer circuit 10 includes an NPN transistor Q1, a PNP transistor Q2, and gate resistors R1 and R2. The buffer circuit 10 is connected between the input terminal 1 and a gate of the semiconductor switching element 3. It is noted that the NPN transistor Q1 and the PNP transistor Q2 are also referred to as "bipolar transistors" unless they are distinguished from each other.

The NPN transistor Q1 for drive, across which a high voltage is applied, and the PNP transistor Q2 for sink, across which a low voltage is applied, constitute a complementary SEPP circuit. In one example of FIG. 1, the NPN transistor Q1 has a base connected to the input terminal 1, a collector connected to a power supply of a voltage Vcc, and an emitter connected to the gate resistor R1. Meanwhile, the PNP transistor Q2 has a base connected to the input terminal 1, a grounded collector, and an emitter connected to the gate resistor R2. The emitters of the NPN transistor Q1 and the PNP transistor Q2 are connected to each other. This produces a single output.

The aforementioned complementary SEPP circuit achieves the following advantages. The aforementioned complementary SEPP circuit, which includes the bipolar transistors, has a small input capacity, thereby reducing a driving signal delay. Further, the aforementioned complementary SEPP circuit, which includes an emitter follower, lowers an output impedance. Still further, the aforementioned complementary SEPP circuit prevents a flow-through current, thereby facilitating the use of the complementary SEPP circuit for various power supply voltages.

The gate resistor R1 is connected between the emitter of the NPN transistor Q1 and the gate of the semiconductor switching element 3. The gate resistor R2 is connected between the emitter of the PNP transistor Q2 and the gate of the semiconductor switching element 3. It is noted the gate resistor R1 and the gate resistor R2 have resistances different from each other.

The aforementioned buffer circuit 10, which includes the gate resistors R1 and R2, controls charging and discharging currents. This enables the SW speeds of the turn-on and turn-off operations to be individually controlled, and by extension, enables the SW speeds to be different from each other.

Reference is now made to a problem of the first related semiconductor device. FIGS. 2 and 3 each are a graph showing results of a simulation in which an input-terminal voltage $V_{IN}$, i.e., a pulse voltage ranging from 0 to 15 V is applied to the input terminal 1 of the first related semiconductor device.

FIG. 2 shows both a time variation of the input-terminal voltage $V_{IN}$ and a time variation of a gate voltage $V_{GE}$ of the semiconductor switching element 3. As seen from FIG. 2, the gate voltage $V_{GE}$ rises and drops more slowly than the input-terminal voltage $V_{IN}$. Accordingly, reverse voltages corresponding to these differences between the voltages are applied across the bipolar transistors.

FIG. 3 shows a time variation of a reverse voltage $V_{BE\_D}$ applied from the emitter of the NPN transistor Q1 to the base of the same. FIG. 3 also shows a time variation of a voltage $V_{BE\_S}$ applied from the emitter of the PNP transistor Q2 to the base of the same. It is noted that a "negative" voltage is applied from the emitter of the PNP transistor to the base of the same in a "normally-on operation"of the PNP transistor. Values of the voltage $V_{BE\_S}$ are "positive" in FIG. 3, and thus the voltage $V_{BE\_S}$ corresponds to a reverse voltage.

As seen from FIG. 3, the magnitude of the reverse voltages $V_{BE\_D}$ and $V_{BE\_S}$ exceed 10 V. On the other hand, the magnitude of a maximum reverse-voltage rating between a base and an emitter of a typical bipolar transistor is 10 V or less. Hence, the first related semiconductor device has a reverse voltage exceeding the maximum reverse-voltage rating of the typical bipolar transistor during the turn-on and turn-off operations of the semiconductor switching element 3.

<Second Related Semiconductor Device>

Figure 4:
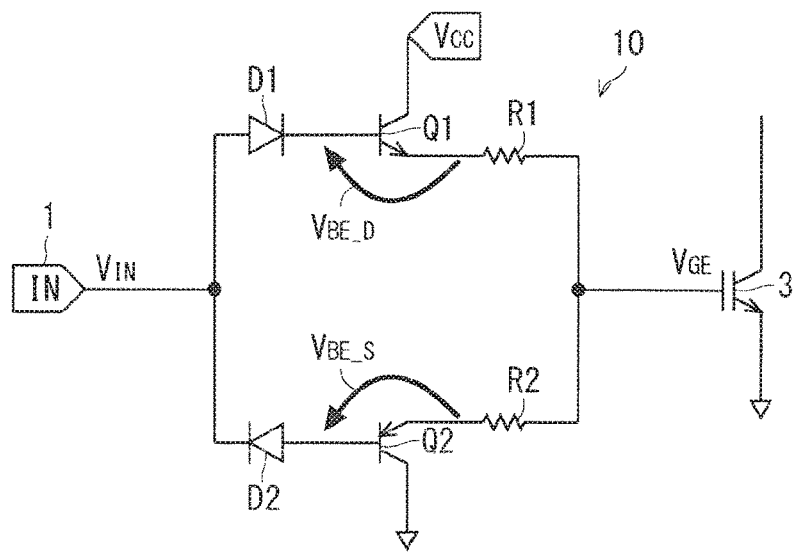
FIG. 4 is a circuit diagram illustrating a configuration of a second related semiconductor device.

FIG. 4 is a circuit diagram illustrating a configuration of the second related semiconductor device. Identical reference symbols arc used to denote identical or similar components between the first related semiconductor device and the second related semiconductor device, and mainly described herein are components different between these semiconductor devices.

The buffer circuit 10 of the second related semiconductor device includes diodes D1 and D2 in addition to the components of the buffer circuit 10 of the first related semiconductor device. The diode D1 is connected between the input terminal 1 and the base of the NPN transistor Q1. The diode D2 is connected between the input terminal 1 and the base of the PNP transistor Q2. By virtue of such a configuration, part of the reverse voltages produced in the first related semiconductor device is distributed to the diodes D1 and D2. Consequently, the second related semiconductor device reduces the reverse voltages of the bipolar transistors.

FIG. 5 corresponds to FIG. 2; and FIG. 6, to FIG. 3. Specifically, FIGS. 5 and 6 each are a graph showing results of a simulation in which the input-terminal voltage $V_{IN}$, i.e., a pulse voltage ranging from 0 to 15 V is applied to the input terminal 1 of the second related semiconductor device.

As seen from FIG. 6, reverse voltages $V_{BE\_D}$ and $V_{BE\_S}$ are 10 V or less. In other words, the second related semiconductor device lowers the reverse voltages compared to the first related semiconductor device.

Nevertheless, FIG. 5 shows that a difference between a flat part of the graph of the input-terminal voltage $V_{IN}$ and a flat part of the graph of the gate voltage $V_{GE}$ is slightly greater than a corresponding difference shown in FIG. 2 by forward voltages of the additional diodes D1 and D2. Accordingly, this difference, and by extension, the reverse voltages of the bipolar transistors need to be reduced. Further, each of the diodes D1 and D2 is connected between the input terminal 1 and the base of the corresponding bipolar transistor. This delays a response of each bipolar transistor to an input signal, which is not revealed by the results of the simulation in FIGS. 5 and 6. In contrast, semiconductor devices according to the following first to fourth embodiments of the present invention solve these problems.

<First Embodiment>

FIG. 7 is a circuit diagram illustrating a configuration of a semiconductor device according to a first embodiment. Identical reference symbols are used to denote identical or similar components between the semiconductor device according to the first embodiment, and the first and second related semiconductor devices, and mainly described herein are components different between these semiconductor devices.

Referring to FIG. 7, the buffer circuit 10 of the semiconductor device includes the NPN transistor Q1, the PNP transistor Q2, the gate resistors R1 and R2, current-limiting resistors R3 and R4, and the diodes D1 and D2.

The NPN transistor Q1 for drive, across which a high voltage is applied, and the PNP transistor Q2 for sink, across which a low voltage is applied, constitute a complementary SEPP circuit, in a manner similar to the aforementioned description.

A first resistor, which in this embodiment is the gate resistor R1, is connected between the gate of the semiconductor switching element 3 and the emitter of NPN transistor Q1. A second resistor, which in this embodiment is the gate resistor R2, is connected between the gate of the semiconductor switching 3 and the emitter of the PNP transistor Q2. For quick switching operations of the semiconductor switching element 3, an example of the gate resistors R1 and R2 is a resistor with a relatively low impedance.

A first load element, which in this embodiment is the diode D1, has one end connected to the gate of the semiconductor switching element 3, and the other end connected to the base of the NPN transistor Q1. In an example of FIG. 7, the anode of the diode D1 is connected to the gate of the semiconductor switching element 3; and the cathode of the diode D1, to the base of the NPN transistor Q1.

Accordingly, clamped to a forward voltage VF of the diode D1 is a total voltage of a reverse voltage applied between the base of the NPN transistor Q1 and the emitter of the same, and a voltage applied across the gate resistor R1 when the reverse voltage is produced. As a result, the diode D1, which is the first load element, reduces the reverse voltage between the base of the NPN transistor Q1 and the emitter of the same.

A second load element, which in this embodiment is the diode D2, has one end connected to the gate of the semiconductor switching element 3, and the other end connected to the base of the PNP transistor Q2. In the example of FIG. 7, the cathode of the diode D2 is connected to the gate of the semiconductor switching element 3; and the anode of the diode D2, to the base of the PNP transistor Q2.

Accordingly, clamped to a forward voltage VF of the D2 is a total voltage of a reverse voltage applied between the base of the PNP transistor Q2 and the emitter of the same, and a voltage applied across the gate resistor R2 when the reverse voltage is produced. As a result, the diode D2, which is the second load element, reduces the reverse voltage between the base of the PNP transistor Q2 and the emitter of the same.

A third resistor, which in this embodiment is the current-limiting resistor R3, is connected between the input terminal 1 and the base of the NPN transistor Q1. Likewise, a fourth resistor, which in this embodiment is the current-limiting resistor R4, is connected between the input terminal 1 and the base of the PNP transistor Q2. These current-limiting resistors R3 and R4 limit currents flowing through the diodes D1 and D2 during the turn-on and turn-off operations of the semiconductor switching element 3. It is noted that the current-limiting resistor R3 has a resistance ranging from several times a resistance of the gate resistor R1 to a resistance multiplied by a current amplification factor hFE of the NPN transistor Q1, and that the current-limiting resistor R4 has a resistance ranging from several times a resistance of the gate resistor R2 to a resistance multiplied by a current amplification factor hFE of the PNP transistor Q2. For instance, let the resistances of the gate resistors R1 and R2 be 10 Ω, and let the current amplification factor hFEs be 200. Accordingly, the current-limiting resistors R3 and R4 have a resistance of 2 kΩ(=10Ω×200). In this case, a relationship is established in which the resistances of the gate resistors R1 and R2 «the resistances of the current-limiting resistors R3 and R4.

Figure 9:
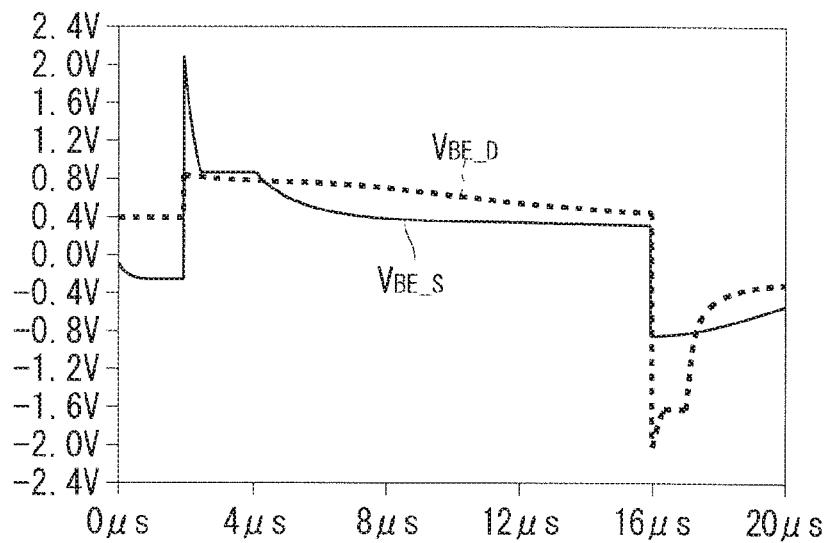
FIG. 9 is a graph showing results of the simulation of the semiconductor device according to the first embodiment.

FIG. 8 corresponds to FIG. 2; and FIG. 9, to FIG. 3. Specifically, FIGS. 8 and 9 each are a graph showing results of a simulation in which the input-terminal voltage $V_{IN}$, i.e., a pulse voltage ranging from 0 to 15 V is applied to the input terminal 1 of the semiconductor device according to the first embodiment.

As shown in FIGS. 8 and 9, the semiconductor device according to the first embodiment is configured such that clamped to the forward voltage VF of the diode D1 or D2 is the total voltage of the reverse voltage applied between the base of each bipolar transistor and the emitter of the same, and the voltage applied across the gate resistor R1 or R2 when the reverse voltage is produced. Such a configuration enables the reverse voltage of the bipolar transistor to be lower than the forward voltage of the diode D1 or D2, thereby reducing the reverse voltage, and by extension, achieving stable operation of the complementary SEPP circuit. Further, the semiconductor device according to first embodiment is configured such that the anode of the diode D1 and the cathode of the diode D2 are short-circuited to each other. Such a configuration enables the use of a small two-in-one packaged diode. This achieves a reduction in component and a reduction in area for mounting the components.

Still further, the semiconductor device according to the first embodiment is configured such that the diode D1 or D2 is not connected between the input terminal 1 and the base of each bipolar transistor. Such a configuration prevents delay of each bipolar transistor in responding to an input signal.

<Second Embodiment>

In the semiconductor device according to the first embodiment, there is a slight difference between the gate voltage $V_{GE}$ and the input-terminal voltage $V_{IN}$ (FIG. 8). A semiconductor device according to a second embodiment reduces the difference between the gate voltage $V_{GE}$ and the input-terminal voltage $V_{IN}$.

Figure 10:
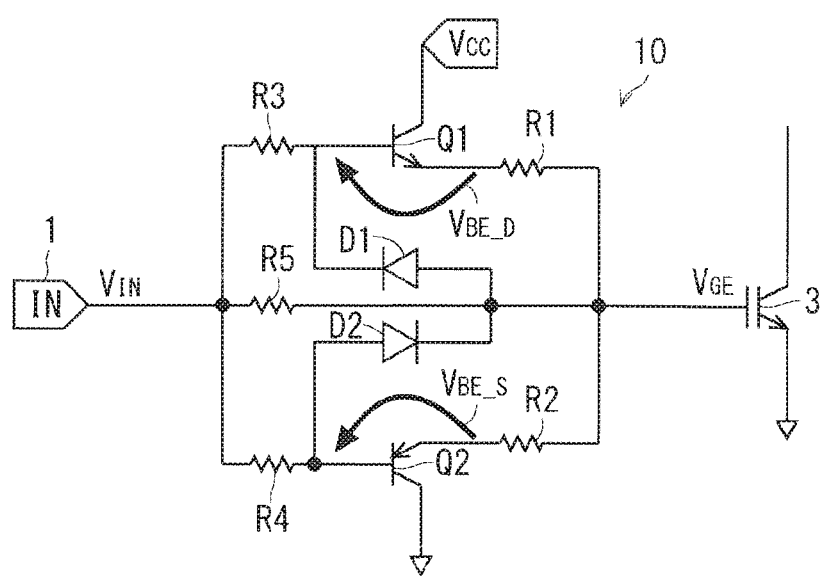
FIG. 10 is a circuit diagram illustrating a configuration of a semiconductor device according to a second embodiment.

FIG. 10 is a circuit diagram illustrating a configuration of the semiconductor device according to the second embodiment. Identical reference symbols are used to denote identical or similar components between the semiconductor device according to the first embodiment and the semiconductor device according to the second embodiment, and mainly described herein are components different between these semiconductor devices.

Referring to FIG. 10, the buffer circuit 10 of the semiconductor device includes a fifth resistor, which in this embodiment is a resistor R5, in addition to the components of the buffer circuit 10 according to the first embodiment. The resistor R5 is connected between the input terminal 1 and the gate of the semiconductor switching element 3. By virtue of such a configuration, a path including the resistor R5 functions as a path through which the input-terminal voltage $V_{IN}$ directly drives and sinks the gate of the semiconductor switching element 3. This enables the gate voltage $V_{GE}$ to be almost the same as the input-terminal voltage $V_{IN}$.

FIG. 11 corresponds to FIG. 2; and FIG. 12, to FIG. 3. Specifically, FIGS. 11 and 12 each are a graph showing results of a simulation in which the input-terminal voltage $V_{IN}$, i.e., a pulse voltage ranging from 0 to 15 V is applied to the input terminal 1 of the semiconductor device according to the second embodiment.

As shown in FIGS. 11 and 12, the semiconductor device according to the second embodiment enables the gate voltage $V_{GE}$ to be almost the same as the input-terminal voltage $V_{IN}$ after a certain period of time from points at which the gate voltage $V_{GE}$ rises and drops. It is noted that although a smaller resistor R5 equates with a shorter certain time period (a time period necessary for charge and discharge), the smaller resistor R5 increases a load current flowing through the input terminal 1. Accordingly, the resistor R5 is preferably set to have a resistance of several kilo-ohms or more.

<Third Embodiment>

FIG. 13 is a circuit diagram illustrating a configuration of a semiconductor device according to a third embodiment. Identical reference symbols are used to denote identical or similar components between the semiconductor device according to the first embodiment and the semiconductor device according to the third embodiment, and mainly described herein are components different between these semiconductor devices.

The buffer circuit 10 according to the third embodiment includes, as the first load element, a resistor R6 instead of the diode D1 (FIG. 7), and includes, as the second load element, a resistor R7 instead of the diode D2 (FIG. 7). The resistor R6 is set to have a resistance determined by $V_{IN} \times R6 / (R3 + R6)$ so as to be less than or equal to a maximum rated value BVEBO of the magnitude of a reverse voltage between the base of the NPN transistor Q1 and the emitter of the same Likewise, the resistor R7 is set to have a resistance determined by $V_{IN} \times R7/(R4 + R7)$ so as to be less than or equal to a maximum rated value BVEBO of the magnitude of a reverse voltage between the base of the PNP transistor Q2 and the emitter of the same. For instance, let the input voltage VIN be a voltage of 15 V; the maximum rated value BVEBO, a voltage of 5 V; the gate resistors R1 and R2, a resistance of 10 Ω; and the current-limiting resistors R3 and R4, a resistance of 2 kΩ. Accordingly, the resistors R6 and R7 have a resistance of 1 kΩ(15×1 / (2+1) =a maximum rated value BVEBO of 5 V). In this case, a relationship is established in which the resistances of the gate resistors R1 and R2 «the resistances of the current-limiting resistors R6 and R7<the resistances of the current-limiting resistors R3 and R4.

Here, a total voltage of a reverse voltage applied between the base of the NPN transistor Q1 and the emitter of the same and a voltage applied across the gate resistor R1 when the reverse voltage is produced, is equal to a voltage applied across the resistor R6. Moreover, the voltage applied across the resistor R6 is determined by divided voltages of the current-limiting resistor R3 and the resistor R6. Hence, selecting appropriate resistances of the current-limiting resistor R3 and the resistor R6 enables the resistor R6, which is the first load element, to reduce the reverse voltage between the base of the NPN transistor Q1 and the emitter of the same. Likewise, selecting appropriate resistances of the current-limiting resistor R4 and the resistor R7 enables the resistor R7, which is the second load element, to reduce the reverse voltage between the base of the PNP transistor Q2 and the emitter of the same.

The semiconductor device according to the third embodiment reduces the reverse voltages of the bipolar transistors, and by extension, enables stable operation of a complementary SEPP circuit, in a manner similar to the first embodiment and the following modification. Further, in a manner similar to the second embodiment, a path including the resistor R6 and a path including the resistor R7 each function as a path through which the input-terminal voltage $V_{IN}$ directly drives and sinks the gate of the semiconductor switching element 3. This enables the gate voltage $V_{GE}$ to be almost the same as the input-terminal voltage $V_{IN}$.

<Modification>

FIG. 14 is a circuit diagram illustrating a configuration of a semiconductor device according to a modification of the third embodiment. In this modification, the resistor R6 has one end connected not to the gate of the semiconductor switching element 3, but to a first connection point CP1 at which the emitter of the NPN transistor Q1 is connected to the gate resistor R1. Likewise, the resistor R7 has one end connected not to the gate of the semiconductor switching element 3, but to a second connection point CP2 at which the emitter of the PNP transistor Q2 is connected to the gate resistor R2.

In such a modification, the resistor R6 reduces a reverse voltage between the base of the NPN transistor Q1 and the emitter of the same in a manner similar to the third embodiment. Moreover, the resistor R7 reduces a reverse voltage between the base of the PNP transistor Q2 and the emitter of the same in a manner similar to the third embodiment.

FIG. 15 corresponds to FIG. 2; and FIG. 16, to FIG. 3. Specifically, FIGS. 15 and 16 each are a graph showing results of a simulation in which the input-terminal voltage $V_{IN}$, i.e., a pulse voltage ranging from 0 to 15 V is applied to the input terminal 1 of the semiconductor device according to the modification.

As shown in FIGS. 15 and 16, the semiconductor device according to the modification reduces the reverse voltages of the bipolar transistors, and by extension, enables stable operation of a complementary SEPP circuit. Further, the semiconductor device according to the modification enables the gate voltage $V_{GE}$ to be almost the same as the input-terminal voltage $V_{IN}$ in a manner similar to the third embodiment.

<Fourth Embodiment>

FIG. 17 is a circuit diagram illustrating a configuration of a semiconductor device according to a fourth embodiment. Identical reference symbols are used to denote identical or similar components between the semiconductor device according to the first embodiment and the semiconductor device according to the fourth embodiment, and mainly described herein are components different between these semiconductor devices.

The buffer circuit 10 according to the fourth embodiment includes, as the first load element, a capacitor C1 instead of the diode D1 (FIG. 7), and includes, as the second load element, a capacitor C2 instead of the diode D2 (FIG. 7).

Here, the capacitor C1 specifies and absorbs a total voltage of a reverse voltage applied between the base of the NPN transistor Q1 and the emitter of the same, and a voltage applied across the gate resistor R1 when the reverse voltage is produced. Accordingly, the capacitor C1, which is the first load element, reduces the reverse voltage between the base of the NPN transistor Q1 and the emitter of the same. Likewise, the capacitor C2, which is the second load element, reduces a reverse voltage between the base of the PNP transistor Q2 and the emitter of the same. It is noted that the current-limiting resistors R3 and R4 limit currents flowing through the capacitors C1 and C2 during the turn-on and turn-off operations of the semiconductor switching element 3.

The semiconductor device according to the fourth embodiment reduces the reverse voltages of the bipolar transistors, and by extension, enables stable operation of a complementary SEPP circuit, in a manner similar to the first embodiment and the following modification.

<Modification>

FIG. 18 is a circuit diagram illustrating a configuration of a semiconductor device according to a modification of the fourth embodiment. In this modification, the capacitor C1 has one end connected not to the gate of the semiconductor switching element 3, but to the first connection point CP1 at which the emitter of the NPN transistor Q1 is connected to the gate resistor R1. Likewise, the capacitor C2 has one end connected not to the gate of the semiconductor switching element 3, but to the second connection point CP2 at which the emitter of the PNP transistor Q2 is connected to the gate resistor R2.

In this modification, the capacitor C1 reduces a reverse voltage between the base of the NPN transistor Q1 and the emitter of the same in a manner similar to the fourth embodiment. Moreover, the capacitor C2 reduces a reverse voltage between the base of the PNP transistor Q2 and the emitter of the same in a manner similar to the fourth embodiment.

FIG. 19 corresponds to FIG. 2; and FIG. 20, to FIG. 3. Specifically, FIGS. 19 and 20 each are a graph showing results of a simulation in which the input-terminal voltage $V_{IN}$, i.e., a pulse voltage ranging from 0 to 15 V is applied to the input terminal 1 of the semiconductor device according to the modification.

As shown in FIGS. 19 and 20, the semiconductor device according to the modification reduces the reverse voltages of the bipolar transistors, and by extension, enables stable operation of a complementary SEPP circuit.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 input terminal, 3 semiconductor switching element, 10 buffer circuit, C1, C2 capacitor, CP1 first connection point, CP2 second connection point, D1, D2 diode, Q1 NPN transistor, Q2 PNP transistor, R1, R2 gate resistor, R3, R4 current-limiting resistor, and R5, R6, R7 resistor.

The invention claimed is:

1. A buffer circuit connected between an input terminal and a gate of a semiconductor switching element, the buffer circuit comprising:
    an NPN transistor and a PNP transistor that constitute a complementary single ended push pull circuit;
    a first resistor connected between the gate and an emitter of the NPN transistor;
    a second resistor connected between the gate and an emitter of the PNP transistor;
    a first load element comprising one end directly connected between an end of the first resistor and the gate and another end connected to a base of the NPN transistor;
    a second load element comprising one end directly connected between an end of the second resistor and the gate and another end connected to a base of the PNP transistor;
    a third resistor connected between the input terminal and the base of the NPN transistor; and
    a fourth resistor connected between the input terminal and the base of the PNP transistor.

2. The buffer circuit according to claim 1, further comprising a fifth resistor connected between the input terminal and the gate.

3. The buffer circuit according to claim 1, wherein the first load element and the second load element each comprises a diode.

4. The buffer circuit according to claim 1, wherein the first load element and the second load element each comprises a resistor.

5. The buffer circuit according to claim 1, wherein the first load element and the second load element each comprises a capacitor.

6. A semiconductor device comprising:
    the buffer circuit according to claim 1;
    the input terminal; and
    the semiconductor switching element.

7. The semiconductor device according to claim 6, wherein the semiconductor switching element comprises a wide bandgap semiconductor.

8. A buffer circuit connected between an input terminal and a gate of a semiconductor switching element, the buffer circuit comprising:
    an NPN transistor and a PNP transistor that constitute a complementary single ended push pull circuit;
    a first resistor connected between the gate and an emitter of the NPN transistor;
    a second resistor connected between the gate and an emitter of the PNP transistor;
    a first load element comprising a resistor having one end connected to a first connection point at which the emitter of the NPN transistor is connected to the first resistor and another end connected to a base of the NPN transistor;
    a second load element comprising a resistor having one end connected to a second connection point at which the emitter of the PNP transistor is connected to the second resistor and another end connected to a base of the PNP transistor;
    a third resistor connected between the input terminal and the base of the NPN transistor; and
    a fourth resistor connected between the input terminal and the base of the PNP transistor.

* * * * *